US008471645B2

(12) United States Patent
Ujita et al.

(10) Patent No.: US 8,471,645 B2
(45) Date of Patent: Jun. 25, 2013

(54) BALANCED-UNBALANCED TRANSFORMER

(71) Applicant: Panasonic Corporation, Osaka (JP)

(72) Inventors: Shinji Ujita, Osaka (JP); Hiroyuki Sakai, Kyoto (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 13/706,419

(22) Filed: Dec. 6, 2012

(65) Prior Publication Data

US 2013/0093531 A1 Apr. 18, 2013

Related U.S. Application Data

(63) Continuation of application No. PCT/JP2011/000162, filed on Jan. 14, 2011.

(30) Foreign Application Priority Data

Jun. 11, 2010 (JP) ................................ 2010-134415

(51) Int. Cl.
*H03H 5/00* (2006.01)
*H01P 3/08* (2006.01)

(52) U.S. Cl.
USPC ............................................ 333/25; 333/238

(58) Field of Classification Search
USPC ............................................ 333/25, 26, 238
See application file for complete search history.

(56) References Cited

U.S. PATENT DOCUMENTS

| | | | | |
|---|---|---|---|---|
| 4,755,775 | A * | 7/1988 | Marczewski et al. | 333/26 |
| 7,471,167 | B2 * | 12/2008 | Kim et al. | 333/26 |
| 8,354,892 | B2 * | 1/2013 | Jeong et al. | 333/26 |
| 2011/0089543 | A1 | 4/2011 | Ujita et al. | |

FOREIGN PATENT DOCUMENTS

| | | |
|---|---|---|
| JP | 2005-244848 | 9/2005 |
| WO | 2009/153956 | 12/2009 |

* cited by examiner

*Primary Examiner* — Dean O Takaoka
(74) *Attorney, Agent, or Firm* — Wenderoth, Lind & Ponack, L.L.P.

(57) ABSTRACT

A balanced-unbalanced transformer includes: a balanced transmission line including paired transmission lines; an unbalanced transmission line; and two lead transmission lines connected to two neighboring end portions of four end portions of the paired transmission lines at a right angle to the paired transmission lines, wherein one of the two lead transmission lines has a first electrode face which faces the other of the two lead transmission lines, the other of the two lead transmission lines has a second electrode face which faces the one of the two lead transmission lines, and the first electrode face and the second electrode face are electrode faces of a capacitor.

19 Claims, 14 Drawing Sheets

BALANCED-UNBALANCED TRANSFORMER

CROSS REFERENCE TO RELATED APPLICATIONS

This is a continuation application of PCT International Application No. PCT/JP2011/000162 filed on Jan. 14, 2011, designating the United States of America, which is based on and claims priority of Japanese Patent Application No. 2010-134415 filed on Jun. 11, 2010. The entire disclosures of the above-identified applications, including the specifications, drawings and claims are incorporated herein by reference in their entirety.

FIELD

The present invention relates to baluns (balanced-unbalanced transformers) which are included in monolithic microwave integrated circuit (MMIC) chips in high-frequency semiconductor devices such as communication devices and radars.

BACKGROUND

In recent years, manufactures of Si semiconductor devices have moved to further finer design rules and have started commercial production of 65-nm CMOS devices. Since transistors manufactured with the finer design rules of CMOS technology can be used at higher frequencies, the manufactures have been promoting research and development of the technology for application to devices which operate at submillimeter waves or millimeter waves, such as an in-vehicle radar or a wireless HDMI system.

Circuits for operation at radio waves in a higher-frequency range such as submillimeter waves or millimeter waves often have a structure for differential signaling so that high tolerance for noise and stable gain can be achieved. On the other hand, in a module including a semiconductor IC, an antenna for transmission and receiving of signals has a structure in which the signals are transmitted through a single line. This structure is intended for reduction in complexity and miniaturization. Here, a balanced-unbalanced transformer which converts between a balanced signal and an unbalanced signal, that is, a balun is necessary for connecting lines for the balanced signal (balanced transmission line) inside a semiconductor IC and a single line (unbalanced transmission line) of an antenna.

There are two types of baluns: one is an active balun including a transistor, and the other is a passive balun including transmission lines. In active baluns, the higher the frequency of a signal, the larger the phase shift of the signal. Furthermore, noise from the transistor included in the balun degrades noise characteristics of the whole system, so that the balun is more likely to be affected by distortion. In contrast, since passive baluns do not include active elements such as a transistor, phase shift in signals is small so that such degradation of noise characteristics and distortion characteristics can be avoided.

Marchand baluns are commonly used passive baluns. A Marchand balun includes unbalanced transmission line and balanced transmission lines. The unbalanced transmission line and balanced transmission lines are not connected so that a direct current cannot flow therebetween. However, signals are transmitted between the unbalanced transmission line and the balanced transmission lines via electro-magnetic coupling between coupled lines as illustrated in FIG. 14A. In a Marchand balun, one unbalanced transmission line is provided with two balanced transmission lines having a dielectric layer between the unbalanced transmission line and the balanced transmission lines so that the same electro-magnetic coupling occurs between the unbalanced transmission line and each of the balanced transmission lines. A basic Marchand balun 100 includes an unbalanced transmission line 101, a first balanced transmission line 102, a second balanced transmission line 103, a single input-output terminal 104, and balanced input-output terminals 105*a* and 105*b*, and a dielectric layer 106. An end portion of the unbalanced transmission line 101 not provided with the single input-output terminal 104 is grounded. An end portion of the balanced transmission line 102 not provided with the balanced input-output terminal 105*a* is also grounded. Similarly, an end portion of the balanced transmission line 103 not provided with the balanced input-output terminal 105*b* is also grounded. Capacitors 107*a*, 107*b*, and 107*c* for blocking a direct current (DC) are provided between these end portions and a ground layer. One of characteristics of the Marchand balun 100 is its small size compared to a rat-race coupler 200 illustrated in FIG. 14B, which is of another type of baluns. The unbalanced transmission line 101 included in the Marchand balun 100 has a length of (λ/2) μm, and the balanced transmission lines 102 and 103 has a length of (λ/4) μm.

The Marchand balun 100 can be made in a smaller size for use with a higher frequency. However, each of the balanced transmission lines 102 and 103 for a frequency as high as 60 GHz still need to be approximately 600 μm long, (on a Si semiconductor substrate such as a CMOS). As such, this has been a problem with further miniaturization of Marchand baluns.

A balun 110 is an example of conventional technique to achieve miniaturization of baluns. The miniaturization has been achieved by providing a capacitor 108 between the balanced outputs of the balun 110 as illustrated in FIG. 15. Hereinafter, a balun including only coupled lines is referred to as a Marchand balun, and a balun including a capacitor provided between its balanced input-output terminals is generically referred to as a balun. In FIG. 15, the components also shown in FIG. 14A are denoted with the same reference signs, and therefore a description thereof is omitted. The capacitor 108 connects the balanced input-output terminals 105*a* and 105*b*. A capacitor 109 is provided between a single input-output terminal and a ground layer. The capacitor 108 between the balanced input-output terminal 105*a* and 105*b* introduces phase lead so that the balanced transmission lines 102 and 103 included in the balun 110 may be (λ/4) μm or shorter. For a balun for the 60-GHz band, the balanced transmission lines 102 and 103 may be shortened to 100 to 200 μm long (on a Si semiconductor substrate such as a CMOS). Although there is a problem that the introduction of phase lead by the capacitor makes the bandwidth of the balun narrower, the balun still has a bandwidth of approximately 10 to 15 GHz. In the ultra wide band (UWB) such as the 24-GHz band or the 60 GHz band, the balun can be used in a bandwidth of approximately 7 GHz, and an occupied bandwidth in the 60 GHz band extends across approximately 500 MHz, which is sufficiently wide.

CITATION LIST

Patent Literature

[Patent Literature 1] Japanese Unexamined Patent Application Publication No, 2005-244848

SUMMARY

Technical Problem

FIG. 16 illustrates a configuration of a conventional balun in further detail. In FIG. 16, the components also shown in FIG. 14A or FIG. 15 are denoted with the same reference signs, and therefore a description thereof is omitted. A Marchand balun core portion 111 includes coupled lines composed of an unbalanced transmission line and balanced transmission lines. A balanced output portion of the Marchand balun core portion 111 and a capacitor 108 are connected by interconnect lines 112*a* and 112*b*.

These interconnect lines are not negligible in designing of baluns for submillimeter waves or millimeter waves, so that design complexity increases because of the necessity of taking into consideration the components in addition to the coupled lines included in the Marchand balun core portion 111. Furthermore, the capacitor included in the balun increases loss in the balun.

The following is a detailed description of these problems with the conventional balun. Since the Si semiconductor substrate is conductive, passive elements and transmission lines on a CMOS have a large loss, for example. A thin-film micro strip line (MSL) has been also presented in which a lowermost metal line formed in a CMOS process is used as a GND plane to block the influence of a conductive Si substrate. However, an interlayer film between the GND plane and a wiring layer in which signal lines are formed are so thin that the signal lines having an impedance of, for example, 50Ω cannot have a large width. This causes a problem that conductor loss of the signal line increases. The post-passivation interconnection process is a technique to solve these problems. In the post-passivation interconnection process, a thick dielectric layer and a wiring layer are added above a semiconductor substrate after Si process. Transmission lines and passive elements are formed in the wiring layer on the dielectric layer as thick as 15 μm or more, so that the influence of a conductive Si substrate on the transmission lines and passive elements is reduced or blocked. When an uppermost metal line formed in the Si process is used as a GND plane, an interlayer film between the GND plane and the wiring layer in which signal lines are formed in the post-passivation interconnection process is so thick that the signal lines having an impedance of, for example, 50Ω can have a large width in comparison with a thin-film MSL structure. As a result, it is possible to reduce conductor loss in the signal lines. Note that the lines may have an impedance other than 50Ω.

FIG. 17 is a schematic perspective view of a semiconductor device formed using a post-passivation interconnection process. The semiconductor device illustrated in FIG. 17 includes a Si semiconductor substrate 120, a dielectric layer 121 formed in a Si process, a wiring layer 122 formed in the Si process, a passivation film 123 formed in the Si process, an internal circuit 124 formed in the Si process, a Si process portion 125 formed in the Si process, dielectric layers 126*a* and 126*b* formed in the post-passivation interconnection process, a lower wiring layer 127*a* formed in the post-passivation interconnection process, an upper wiring layer 127*b* formed in the post-passivation interconnection process, a contact via 128 connecting the wiring layer 127*a* and the wiring layer 122, and a post-passivation interconnection process portion 129.

FIG. 18A is a perspective view of a balun including a Marchand balun core portion formed by the post-passivation interconnection process. FIG. 18B is a side view of a cross section A-A in FIG. 18A viewed from the y direction. In FIG. 18A and FIG. 18B, the components also shown in any of FIG. 14A to FIG. 17 are denoted with the same reference signs, and therefore a description thereof is omitted. A contact via 130 interconnects the lines formed in the Si process. A Marchand balun core portion 111 is formed in the lower wiring layer 127*a* in the post-passivation interconnection process. The balanced output of the Marchand balun core portion 111 is connected to the capacitor 108 through the contact via connecting the post-passivation interconnection process portion 129 and the Si process portion 125, a line included in the wiring layer 122, and the contact via 130. The capacitor 108 reaches a balanced output ports 105*a* and 105*b* through the line included in the wiring layer 122, the contact via 130, and a contact via 128 connecting the post-passivation interconnection process portion 129 and the Si process portion 125.

Complexity in design of a balun including a capacitor increases because of the necessity of taking into consideration the contact via 128 connecting the post-passivation interconnection process portion 129 and the Si process portion 125, and the contact via 130 connecting the lines formed in the Si process. This leads to increase in loss in the balun.

Conceived to address the above problem, the present invention has an object of providing a balun (balanced-unbalanced transformer) which can be designed with less complexity and has a reduced loss.

Solution to Problem

In order to solve the problems, provided is a balanced-unbalanced transformer according to an aspect of the present invention includes: a balanced transmission line including paired transmission lines for input or output of a balanced signal, the paired transmission lines being disposed adjacently and aligned in a longitudinal direction; an unbalanced transmission line for input or output of an unbalanced signal, the unbalanced transmission line being in parallel with the balanced transmission line and facing the balanced transmission line; two lead transmission lines one of which is connected to one end portion of one of the paired transmission lines at a right angle to the one of the paired transmission lines, and the other of which is connected to one end portion of the other of the paired transmission lines at a right angle to the other of the paired transmission lines, the one end portion of the one of the paired transmission lines and the one end portion of the other of the paired transmission lines being neighboring two end portions of four end portions of the paired transmission lines, wherein the one of the two lead transmission lines has a first electrode face which faces the other of the two lead transmission lines, the other of the two lead transmission lines has a second electrode face which faces the one of the two lead transmission lines, and the first electrode face and the second electrode face are electrode faces of a capacitor.

In this configuration, the first electrode face and the second electrode face of the two lead transmission lines face each other and are electrode faces of a capacitor. Lines and contact vias for connection with a capacitor are therefore no longer necessary, so that the balun (balanced-unbalanced transformer) can be designed with less complexity, and the balun thereby has a reduced loss.

The balanced-unbalanced transformer may further include: a silicon semiconductor substrate; a first dielectric layer stacked above the silicon semiconductor substrate; a wiring layer stacked above the first dielectric layer; a protective layer stacked above the wiring layer; a second dielectric layer stacked above the protective layer; and a plurality of wiring layers included in the second dielectric layer; wherein the balanced transmission line, the unbalanced transmission line, and the two lead transmission lines are included in the plurality of wiring layers.

The balun in this configuration can be designed with less complexity, especially for the one to be manufactured using the post-passivation interconnection process, and the balun has an effectively reduced loss.

The balanced-unbalanced transformer may include a first transmission line extending in a first direction in a first wiring layer which is one of the wiring layers included in the second dielectric layer; a second transmission line extending in the first direction in a second wiring layer which is an other of the wiring layers included in the second dielectric layer and not in contact with the first wiring layer; and a via electrically connecting a first end portion of the first transmission line and a second end portion of the second transmission line in a region where the first end portion and the second end portion overlap each other in a layer-stacking direction, the first end portion being one end portion of the first transmission line and located in a direction opposite to the first direction, and the second end portion being one end portion of the second transmission line and located in the first direction, the balanced transmission line includes: a third transmission line being the one of the paired transmission lines and extending in the first direction in the first wiring layer; and a fourth transmission line being the other of the paired transmission lines and extending in the first direction in the second wiring layer, the one of the two lead transmission lines is a fifth transmission line extending in a second direction from a third end portion of the third transmission line, the second direction being perpendicular to the first direction and the layer-stacking direction, and the third end portion being one end portion of the third transmission line and located in the direction opposite to the first direction, the other of the two lead transmission lines is a sixth transmission line extending in the second direction from a fourth end portion of the fourth transmission line, the fourth end portion being one end portion of the fourth transmission line and located in the first direction, one of (i) the other end portion of the first transmission line and (ii) the other end portion of the second transmission line is grounded, and the other of (i) the first transmission line and (ii) the other end portion of the second transmission line is an end portion for input or output of the unbalanced signal, the other end portion of the third transmission line is grounded, the other end portion of the fourth transmission line is grounded, the fifth transmission line and the sixth transmission line are transmission lines for output or input of the balanced signal, the fifth transmission line has the first electrode face which faces the sixth transmission line, and the sixth transmission line has the second electrode face which faces the fifth transmission line.

In this configuration, the fifth transmission line and the sixth transmission line are respectively formed in the first wiring layer and the second wiring layer, so that the first electrode face and the second electrode face can be designed with high flexibility in terms of area size, and thereby the capacitance of a capacitor in the balun can be adjusted with high accuracy through design.

The balanced-unbalanced transformer may further include: a first ground electrode facing the one of (i) the other end portion of the first transmission line and (ii) the other end portion of the second transmission line; a second ground electrode facing the other end portion of the third transmission line; and a third ground electrode facing the other end portion of the fourth transmission line, wherein the one of (i) the other end portion of the first transmission line and (ii) the other end portion of the second transmission line is grounded via the first ground electrode, the other end portion of the third transmission line is grounded via the second ground electrode, and the other end portion of the fourth transmission line is grounded via the third ground electrode.

In this configuration, capacitors are formed between the first ground electrode and one of the end portions of the unbalanced transmission line and between the second and third ground electrodes and the end portions of the balanced transmission line, so that direct current (DC) components in a balanced signal and an unbalanced signal can be blocked.

The balanced-unbalanced transformer may further include a fourth ground electrode facing, via a dielectric layer, the other of (i) the other end portion of the first transmission line and (ii) the other end portion of the second transmission line.

In this configuration, a capacitor is formed between the fourth ground electrode and the first end portion, so that direct current (DC) components in a balanced signal or an unbalanced signal can be blocked.

The may further include a first nanocomposite film interposed between the first electrode face and the second electrode face, wherein the first nanocomposite film includes a second material in which particles of a first material are dispersed, the particles of the first material have a diameter of 1 nm to 200 nm, and the first material has a relative permittivity higher than a relative permittivity of the second material and a dielectric loss higher than a dielectric loss of the second material.

The balanced-unbalanced transformer may further comprising a second nanocomposite film interposed between the unbalanced transmission line and the balanced transmission line, wherein the second nanocomposite film includes the second material in which particles of the first material are dispersed.

The first material may include one of strontium titanate and barium strontium titanate, and the second material includes one of benzocyclobutene, polyimide, polytetrafluoroethylene, and polyphenylene oxide.

In order to solve the problems, provided is a balanced-unbalanced transformer according to another aspect of the present invention includes: a first transmission line extending in a first direction in a first wiring layer; a second transmission line extending in the first direction in a second wiring layer which is not in contact with the first wiring layer; a unbalanced transmission line including the first transmission line and the second transmission line and a via which electrically connects the first transmission line and the second transmission line in a region where the first transmission line and the second transmission line overlap each other in a layer-stacking direction; and a balanced transmission line including: a third transmission line extending in the first direction in the first wiring layer; and a fourth transmission line extending in the first direction in the second wiring layer, wherein the third transmission line and the fourth transmission line have a first overlap region where the third transmission line and the fourth transmission line overlap in the layer-stacking direction, and the balanced-unbalanced transformer further includes: a fifth transmission line extending from the third transmission line in the first overlap region in a second direction which is perpendicular to the first direction in the same plane; and a sixth transmission line extending from the fourth transmission line in the first overlap region in the second direction. In this configuration, one open end of the first transmission line included in the unbalanced transmission line, and the end portions of the balanced transmission line other than the third and fourth end portions in the first overlap region are grounded.

Furthermore, it is preferable that the one end portion of the first transmission line included in the unbalanced transmission line and grounded and a ground electrode included in a third wiring layer be disposed to overlap via a dielectric layer, and the end portions of the balanced transmission line other than the third and fourth end portions in the first overlap region are not and ground electrodes included in a third wiring layer be disposed to overlap via a dielectric layer.

Furthermore, it is preferable that the other end portion of the first transmission line included in the unbalanced transmission line and a wiring layer different from the first wiring layer including the first transmission line are disposed to overlap each other via a dielectric layer.

Advantageous Effects

In the balun (balanced-unbalanced transformer) according to the present invention, a Marchand balun core portion and a capacitor are directly connected without using a line or a contact via, so that the balun can be designed with less complexity and has a reduced loss.

BRIEF DESCRIPTION OF DRAWINGS

These and other objects, advantages and features of the invention will become apparent from the following description thereof taken in conjunction with the accompanying drawings that illustrate a specific embodiment of the present invention.

DESCRIPTION OF EMBODIMENTS

Embodiment 1

A balun (balanced-unbalanced transformer) according to Embodiment 1 includes: a balanced transmission line including paired transmission lines for input or output of a balanced signal, the paired transmission lines being disposed adjacently and aligned in a longitudinal direction; an unbalanced transmission line for input or output of an unbalanced signal, the unbalanced transmission line being in parallel with the balanced transmission line and facing the balanced transmission line; and two lead transmission lines one of which is connected to one end portion of one of the paired transmission lines at a right angle to the one of the paired transmission lines, and the other of which is connected to one end portion of the other of the paired transmission lines at a right angle to the other of the paired transmission lines, the one end portion of the one of the paired transmission lines and the one end portion of the other of the paired transmission lines being neighboring two end portions of four end portions of the paired transmission lines.

The one of the two lead transmission lines has a first electrode face which faces the other of the two lead transmission lines. The other of the two lead transmission lines has a second electrode face which faces the one of the two lead transmission lines. The first electrode face and the second electrode face are electrode faces of a capacitor.

In this configuration, the first electrode face and the second electrode face of the two lead transmission lines face each other and are electrode faces of a capacitor. Lines and contact vias for connection with capacitors are therefore no longer necessary, so that the balun can be designed with less complexity, and the balun (balanced-unbalanced transformer) thereby has a reduced loss.

The balun according to Embodiment 1 of the present invention will be described below using the drawings.

Figure 1A:
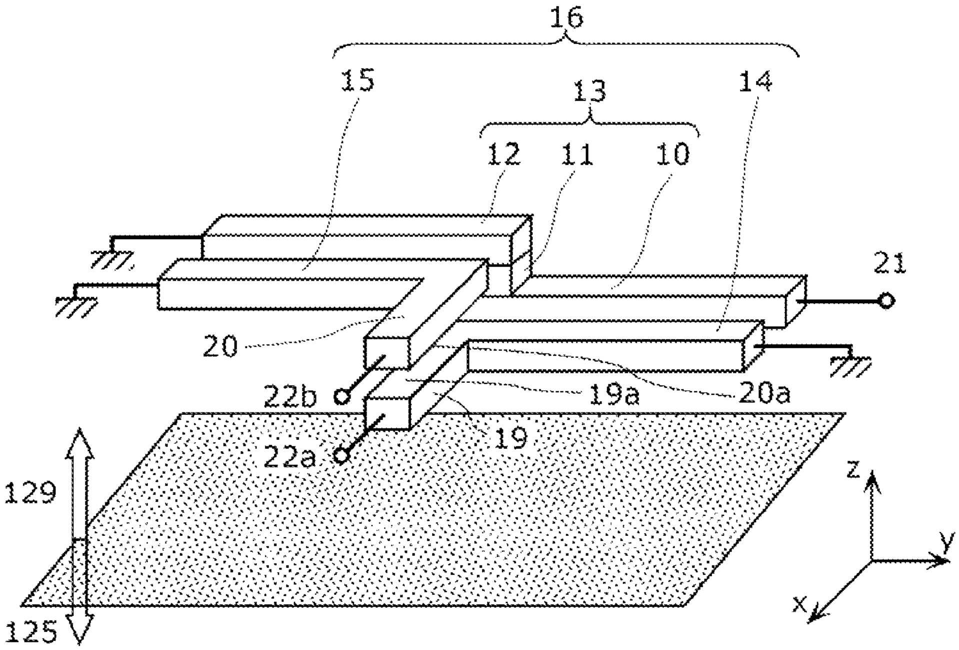
FIG. 1A is a perspective view illustrating a structure of a balun according to Embodiment 1 of the present invention.
Figure 2A:
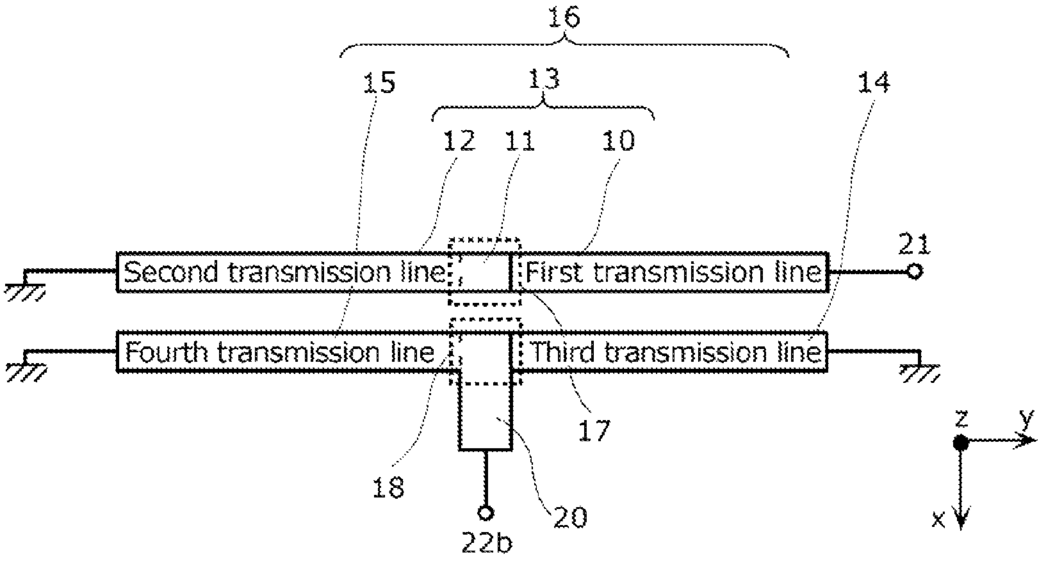
FIG. 2A is a plan view illustrating the structure of the balun according to Embodiment 1 of the present invention viewed from the z direction.
Figure 3A:
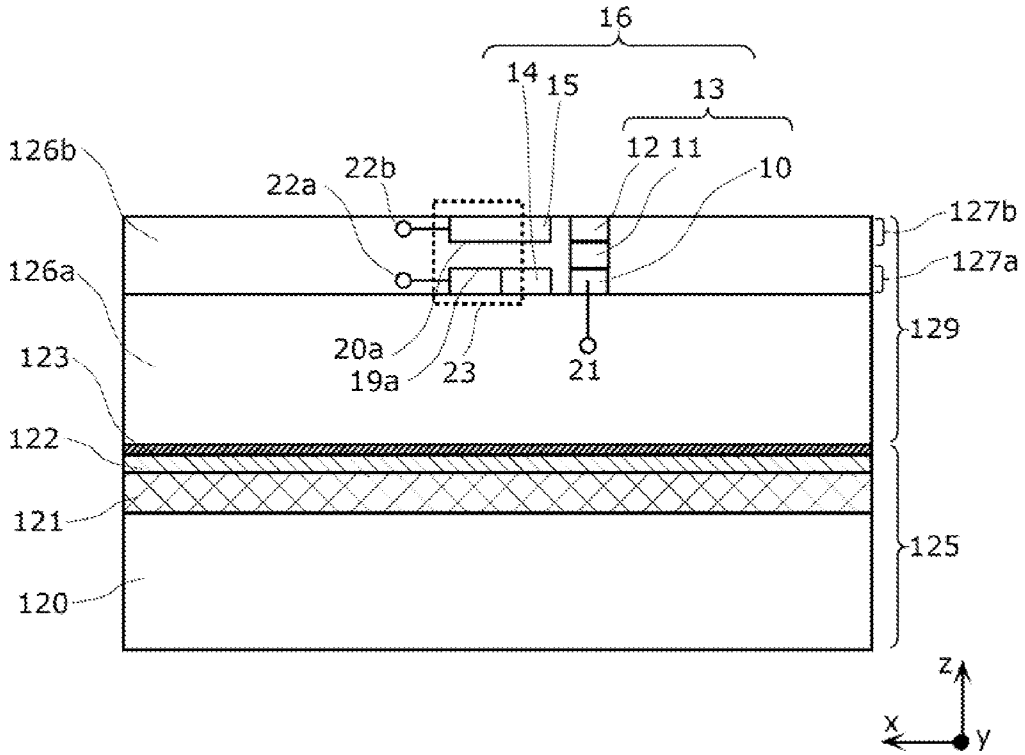
FIG. 3A is a side view illustrating the structure of the balun according to Embodiment 1 of the present invention viewed from the y direction.
Figure 17:
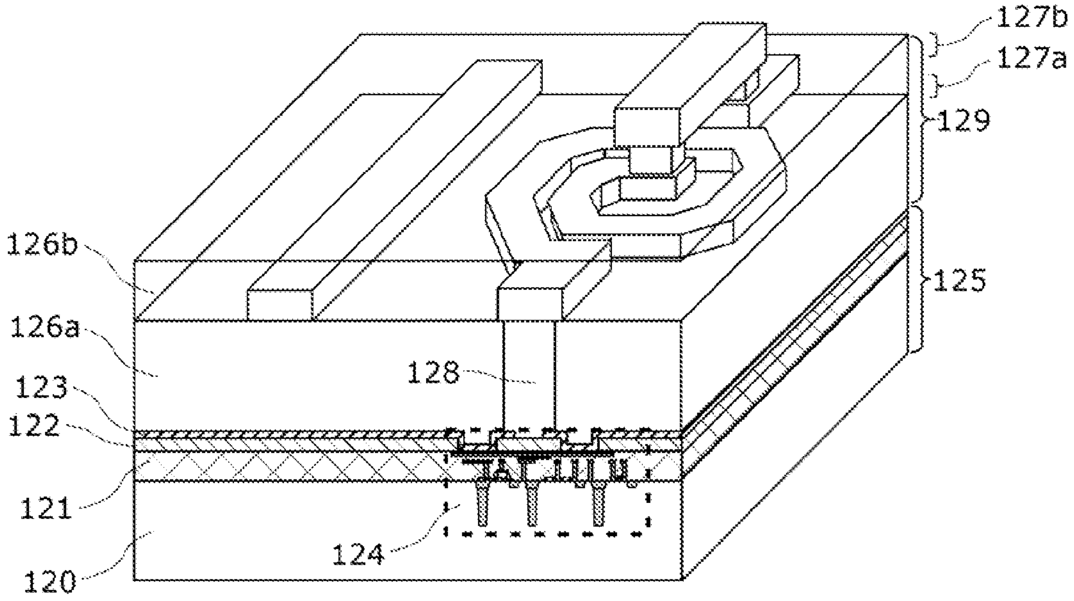
FIG. 17 Prior Art
FIG. 17 is a perspective view of a semiconductor device formed using the post-passivation interconnection process.
Figure 18A:
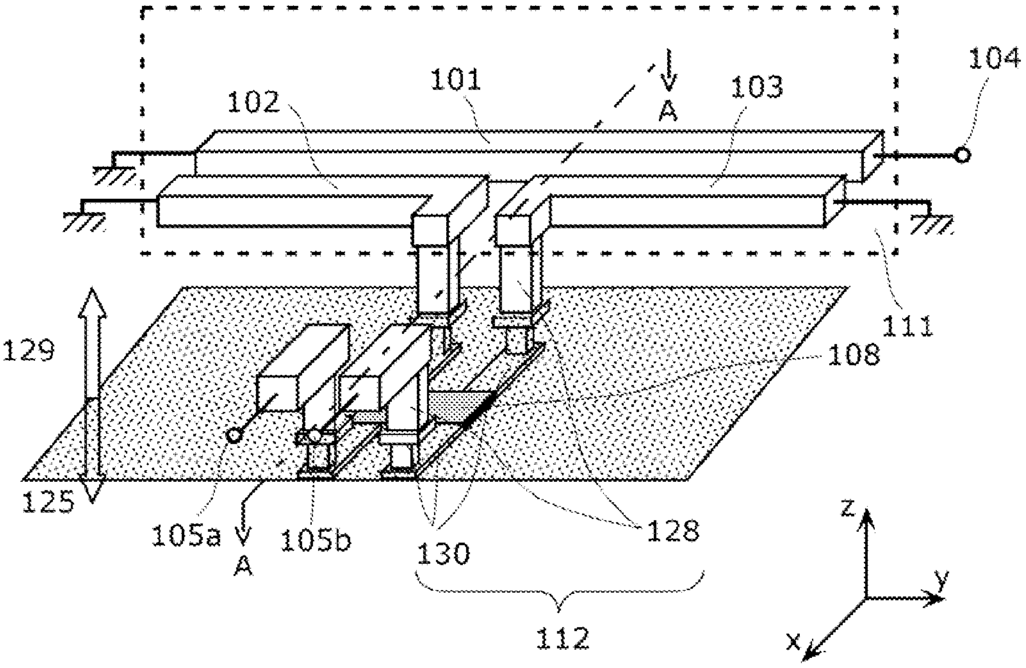
FIG. 18A Prior Art
FIG. 18A is a perspective view of a structure of a balun formed using the post-passivation interconnection process.
Figure 18B:
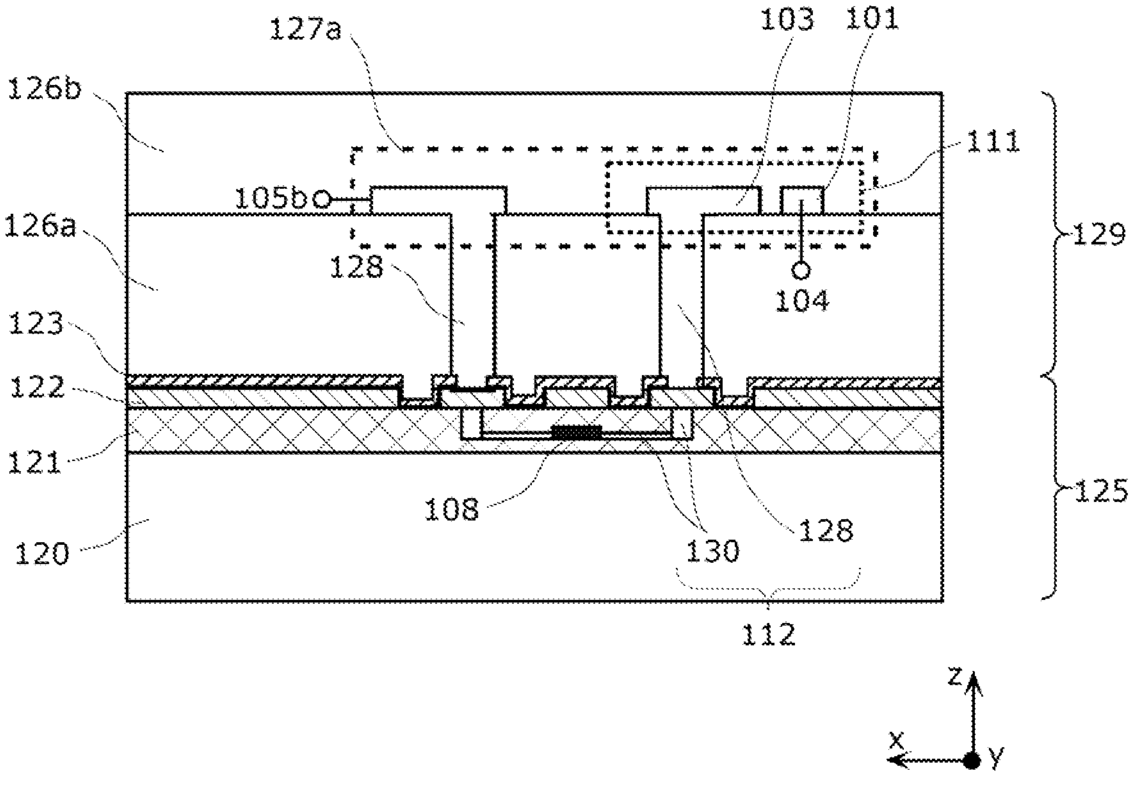
FIG. 18B Prior Art
FIG. 18B illustrates a cross section A-A in FIG. 18A viewed from the y direction.

FIG. 1A is a perspective view of a balun according to Embodiment 1. FIG. 2A is a plan view of the balun according to Embodiment 1 viewed from the z direction. FIG. 3A is a side view of the balun according to Embodiment 1 viewed from the y direction. FIG. 3A is a transparent view showing internal wiring of the balun for illustrative purposes. The balun according to Embodiment 1 is formed using the post-passivation interconnection process illustrated in FIG. 17. In FIGS. 1A, 2A, and 3A, the components also shown in FIG. 17, FIG. 18A, or FIG. 18 are denoted with the same reference signs, and therefore a description thereof is omitted.

The balanced-unbalanced transformer includes a silicon (Si) semiconductor substrate 120, a first dielectric layer 121 (also referred to as a dielectric layer formed in the Si process) formed above the silicon semiconductor substrate, a wiring layer 122 (also referred to as wiring layer formed in the Si process) stacked above the first dielectric layer 121, a protective layer 123 (a passivation film formed in the Si process) stacked above the wiring layer 122, second dielectric layers 126*a* and 126*b* stacked above the protective layer 123, and wiring layers 127*a* and 127*b* included in the upper one of the second dielectric layers. The balanced transmission line, the unbalanced transmission line, and the two lead transmission lines are included in the wiring layers. The balun in this configuration can be designed with less complexity, especially for the one to be manufactured using the post-passivation interconnection process, and the balun has an effectively reduced loss.

In this configuration, a post-passivation interconnection process portion 129, which is additionally provided on a Si process portion 125, includes the lower wiring layer 127*a* and the upper wiring layer 127*b*. A transmission line 10 is included in the lower wiring layer 127*a*, and a transmission line 12 is included in the upper wiring layer 127*b*. The transmission lines 10 and 12 are formed so as to have an overlap region 17 therebetween as illustrated in FIG. 2A. The transmission lines 10 and 12 are connected via a contact via 11 in the overlap region 17. The transmission line 10, transmission line 12, and contact via 11 compose an unbalanced transmission line 13. The transmission line 10 in the unbalanced transmission line 13 has a single input-output terminal 21 at one end portion thereof which is not in the overlap region 17. Signals are input and output to and from the single input-output terminal 21. The end portion of the transmission line 12 not in the overlap region 17 is connected to a ground electrode layer.

A transmission line 14 is included in the lower wiring layer 127*a* in the post-passivation interconnection process portion 129 and is coplanar with the transmission line 10 as illustrated in FIG. 3A. The transmission line 14 is identical with the transmission line 10 in length as illustrated in FIG. 2A. A transmission line 15 is included in the upper wiring layer 127*b* and is coplanar with the transmission line 12 as illustrated in FIG. 3A. The transmission line 15 is identical to the transmission line 12 in length as illustrated in FIG. 2A. The transmission lines 14 and 15 have an overlap region 18 therebetween as shown in FIG. 2A but are not connected by a contact via. Each of them is a balanced transmission line. The transmission lines 14 and 15 each have a balanced input-output terminal at one end portion in the overlap region 18, and each are connected to the ground electrode layer at the other end portion, which is the end portion not in the overlap region 18.

The unbalanced transmission line 13 and transmission lines 14 and 15 compose a Marchand balun core portion 16.

A transmission line 19 extends in the X direction from the overlap region 18 of the transmission line 14. A transmission line 20 extends in the X direction from the overlap region 18 of the transmission line 15. These transmission lines 14 and 15 are identical in length and face each other via the dielectric layer as illustrated in FIG. 2A and FIG. 3A. The upper face of the transmission line 19 is a first electrode face 19*a*. The lower face of the transmission line 20 is a second electrode face 20*a*. The first electrode face 19*a* and the second electrode face 20*a* are electrode faces of a capacitor. Specifically, the portion between the transmission line 19 and the transmission line 20 illustrated in FIG. 3A has a capacitance so that the portion between the transmission line 19 and the transmission line 20 functions as a capacitor 23 interposed between the balanced input-output terminals. The transmission line 19 has a balanced input-output terminal 22*a* at one end portion, which is the end portion not in the overlap region 18. The transmission line 20 has a balanced input-output terminal 22*b* at one end portion, which is the end portion not in the overlap region 18.

In this configuration, the Marchand balun core portion 16 and the capacitor 23 are directly connected. No lines or contact vias to connect the Marchand balun core portion 16 and the capacitor 23 are necessary, so that the balun including the capacitor can be designed with less complexity, and the balun has a reduced loss.

Figure 4:
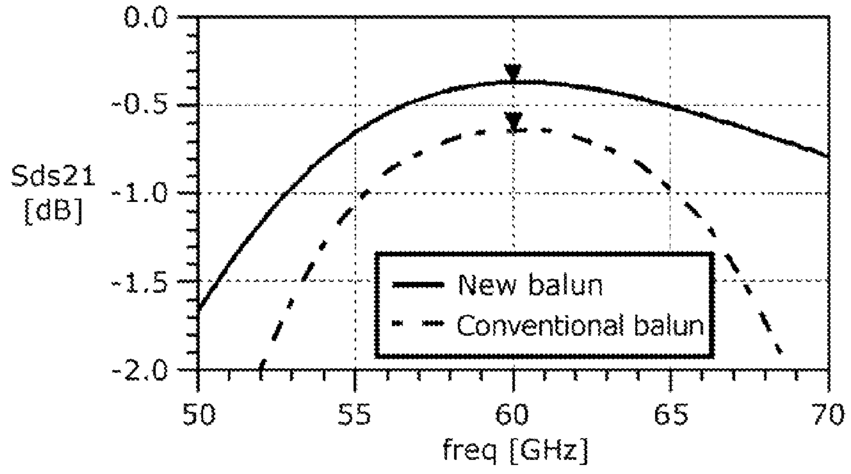
FIG. 4 is a graph showing frequency dependence of conversion loss in baluns.

FIG. 4 is a graph showing conversion loss of an unbalanced signal in a new balun and a conventional balun. The unbalanced signal is transmitted through an unbalanced transmission line and lost from conversion into a balanced signal through electro-magnetic coupling in a coupled line portion to balanced output through a balanced transmission line. The new balun has a structure in which a Marchand balun core portion and a capacitor are directly connected according to Embodiment 1. The conventional balun has a structure illustrated in FIG. 18A and FIG. 18B.

As can be seen from FIG. 4, conversion loss (Sds21) in conversion from an unbalanced signal into a balanced signal by the new balun is small compared to conversion loss in the conventional balun.

It should be noted that the ground terminal of the transmission line 12 in the unbalanced transmission line 13 and the ground terminals of the transmission lines 14 and 15 in the balanced transmission line need not be grounded. They may be open ends, connected to nothing.

It should be also noted that a component capable of blocking a direct current (DC) components, such as a capacitor, may be serially connected between the ground terminal portion of the transmission line 12 in the unbalanced transmission line 13 and the ground layer or between ground terminal portions of the transmission line 14 and the transmission line 15 in the balanced transmission line and the ground layer.

For the purpose of impedance matching to external circuitry, a capacitor may be provided to the single input-output terminal 21 of the transmission line 10 in the unbalanced transmission line 13 so that the capacitor is parallel to the transmission line 10.

Optionally, one or more wiring layers and one or more dielectric layers may be included in the Si process portion 125 in addition to the wiring layers 122 and dielectric layers 121 illustrated in FIG. 3A.

Optionally, the post-passivation interconnection process portion 129 may include wiring layers more than the two wiring layers which are described as the minimum in Embodiment 1.

Alternatively, in Embodiment 1, the transmission lines 12 and 15 included in the upper wiring layer 127*b* may be included in the lower wiring layer 127*a*, and the transmission lines 10 and 14 included in the lower wiring layer 127*a* may be included in the upper wiring layer 127*b*.

Optionally, the balun structure above the post-passivation interconnection process portion 129 in Embodiment 1 may be included in the same configuration in the wiring layer in the Si process portion 125.

The post-passivation interconnection process wiring layers 127*a* and 127*b* included in the balun according to Embodiment 1 are preferably identical in thickness.

The width and length of the transmission lines 19 and 20 included in the balun according to Embodiment 1 are adjusted so that the capacitor 23 has a desired capacitance. The capacitance is determined so as to reduce conversion loss in the balun.

Figure 5A:
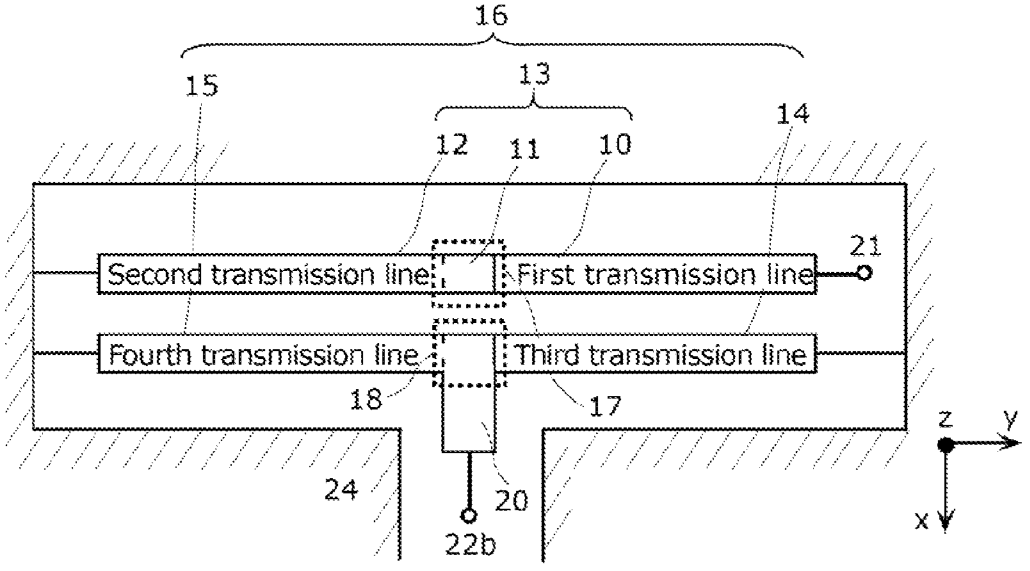
FIG. 5A is a plan view illustrating the structure of the balun according to Embodiment 1 of the present invention viewed from the z direction, where a ground plane is coplanar with transmission lines.
Figure 5B:
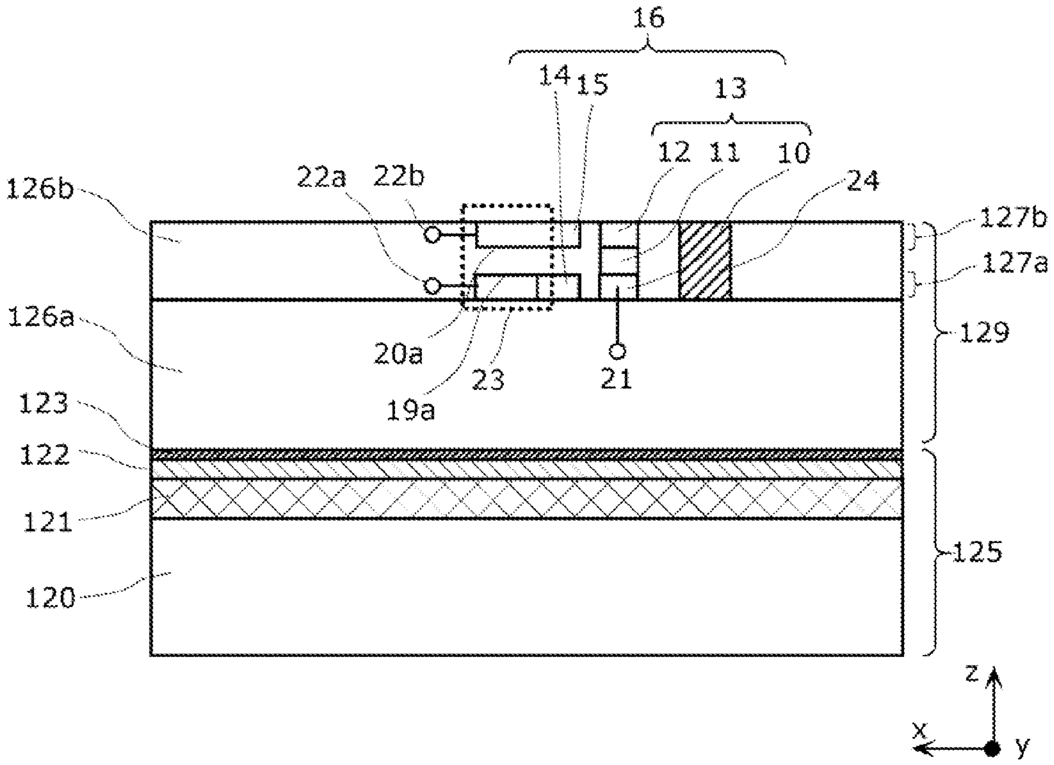
FIG. 5B is a side view of a balun with a ground plane viewed from the y direction.

It is preferable in the balun according to Embodiment 1 that a ground plane 24 be provided using the wiring layers 127*a* and 127*b* and be placed at a given distance from all the transmission lines included in the balun. FIG. 5A is a plan view of a balun with the ground plane 24 viewed from the z direction. FIG. 5B is a side view of a balun with the ground plane 24 viewed from the y direction. FIG. 5B is a transparent view to showing internal wiring of the balun for illustrative purposes. It is preferable that the ground plane 24 have a multilayer structure in which the wiring layers 127*a* and 127*b* are connected via as many contact vias as possible as illustrated in FIG. 5B. A preferable distance between the ground plane 24 and any of the transmission lines included in the balun is 10 μm or longer; but a distance shorter than 10 μm is acceptable. Although an end of each of the transmission lines 12, 14, and 15 is connected to the ground plane 24 in FIG. 5B, these ends need not be connected to the ground plane 24 and may be open ends.

The ground plane 24 and the transmission lines included in the balun need not be coplanar (that is, they need not form a coplanar-type structure). Optionally, the ground plane 24 and the transmission lines may form a microstrip-type structure such that the wiring layer 122, which is the topmost layer wiring of the Si process portion 125 as illustrated in FIG. 5B, is a ground plane. In this case, it is preferable that the ground plane have an area larger or equal to the area occupied by the balun. Optionally, the balun may be of a grounded coplanar type such that the wiring layer 122 also functions as a ground plane in addition to the ground plane 24. In this case, it is preferable that the ground plane 24 and the wiring layer 122 as a ground plane be connected via as many contact vias 128 as possible (see FIG. 18B) so that they can be maintained at the same potential.

As described above, the balanced-unbalanced transformer according to Embodiment 1 is configured as follows.

The unbalanced transmission line 13 includes the transmission line 10 (first transmission line) included in the first wiring layer and extending in the first direction (y direction), the transmission line 12 (second transmission line) included in the second wiring layer and extending in the first direction, and the contact via 11. The first wiring layer and the second wiring layer are not in contact with each other. The transmission line 10 has a first end portion which is one end portion of the transmission line 10 and located in the direction opposite to the first direction. The second transmission line 12 has a second end portion which is one end portion of the transmission line 12 and located in the first direction. The first end portion and the second end portion overlap each other in the layer-stacking direction in the overlap region 17. The contact via 11 electrically connects the first end portion and the second end portion in the overlap region 17.

The balanced transmission line includes the transmission line 14 (third transmission line) and the transmission line 15 (fourth transmission line). The transmission line 14 is one of paired transmission lines and included in the first wiring layer, extending in the first direction. The transmission line 15 is the other of the paired transmission lines and included in the second wiring layer, extending in the first direction.

One of the two lead transmission lines is the transmission line 19 (fifth transmission line) extending in a second direction (x direction) from a third end portion which is one end portion of the transmission line 14 and located in the direction opposite to the first direction. The second direction is perpendicular to the first direction and the plane extending in the layer-stacking direction. The other of the two lead transmission lines is the transmission line 20 (sixth transmission line) extending in the second direction from a fourth end portion which is one end portion of the transmission line 15 and located in the first direction.

One of (i) the other end portion of the transmission line 10, which is the end portion different from the first end portion, and (ii) the other end portion of the transmission line 12, which is the end portion different from the second end portion, is grounded, and the other of (i) the other end portion of the transmission line 10 and (ii) the other end portion of the transmission line 12 is an end portion for input or output of unbalanced signals.

The other end portion of the transmission line 14, which is the end portion different from the third end portion, is grounded.

The other end portion of the transmission line 15, which is the end portion different from the fourth end portion, is grounded.

The transmission lines 19 and 20 are transmission lines for output or input of balanced signals.

The transmission line 19 has a first electrode face 19*a* which faces the transmission line 20.

The transmission line 20 has a second electrode face 20*a* which faces the transmission line 19.

In this configuration, the transmission line 19 and the transmission line 20 are respectively formed in the first wiring layer and the second wiring layer, so that the first electrode face and the second electrode face can be designed with high flexibility in terms of area size, and thereby the capacitance of a capacitor in the balun can be adjusted with high accuracy through design.

Variation of Embodiment 1

Figure 1B:
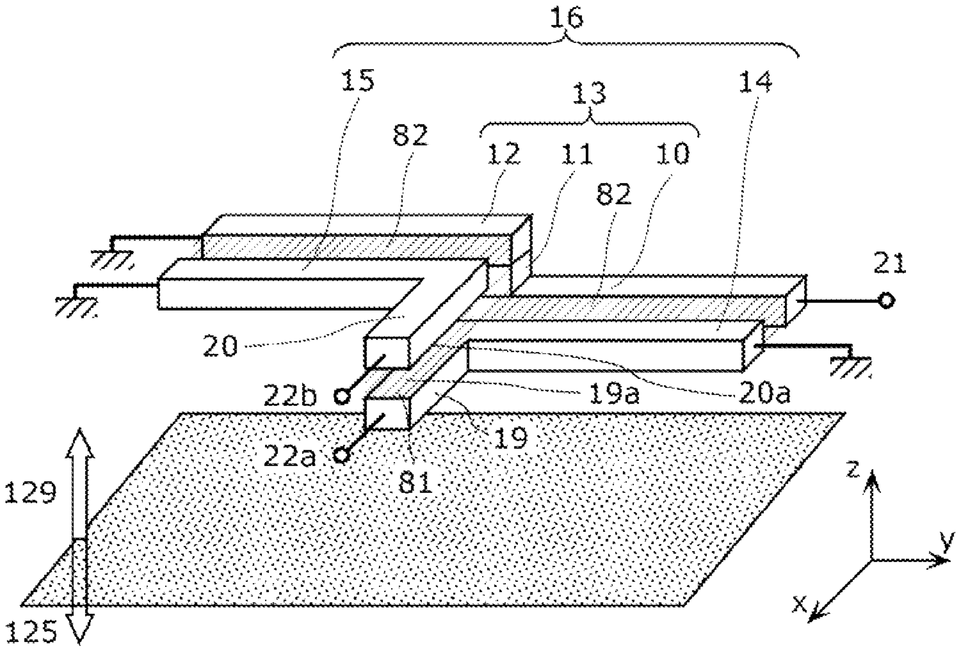
FIG. 1B is a perspective view illustrating a structure of a balun according to a first variation of Embodiment 1 of the present invention.
Figure 2B:
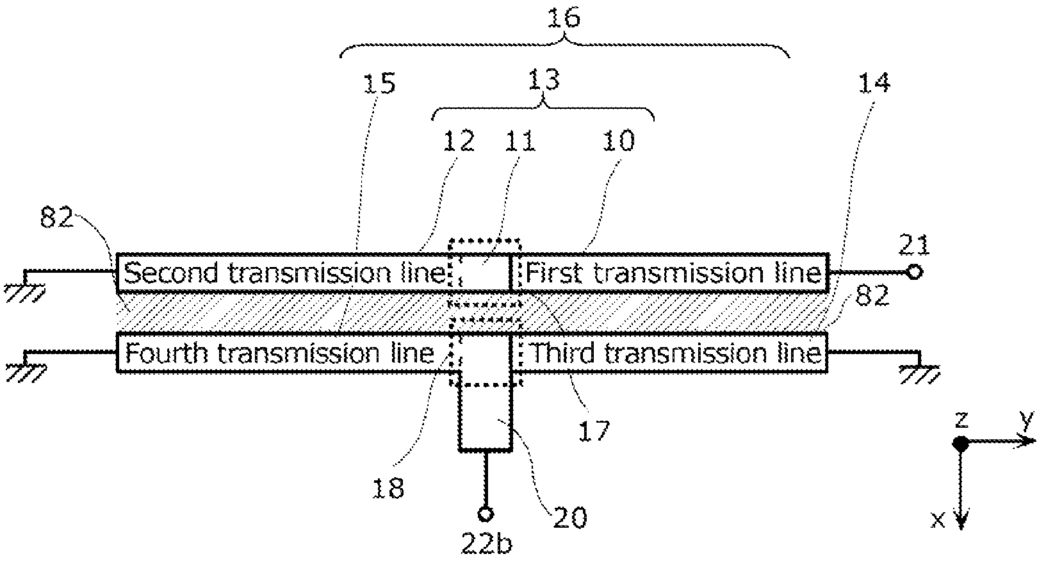
FIG. 2B is a plan view illustrating the structure of the balun according to the first variation of Embodiment 1 of the present invention viewed from the z direction.
Figure 3B:
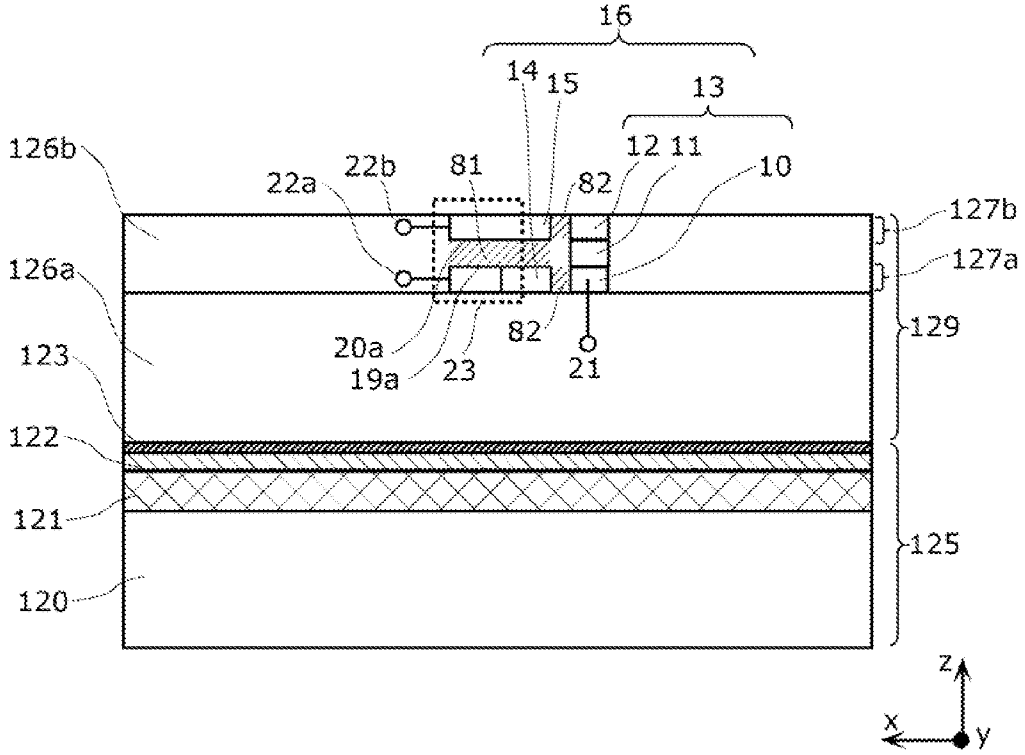
FIG. 3B is a side view illustrating the structure of the balun according to the first variation of Embodiment 1 of the present invention viewed from the y direction.

A balun according to a variation of Embodiment 1 of the present invention will be described below. FIG. 1B is a perspective view illustrating a structure of a balun according to a variation of Embodiment 1. FIG. 2B is a plan view illustrating the structure of the balun according to the variation viewed from the z direction. FIG. 3B is a side view illustrating the structure of the balun according to the variation viewed from the y direction.

The balun illustrated in FIGS. 1B, 2B, and 3B is different from the balun illustrated in FIGS. 1A, 2A, and 3A in the presence of first and second nanocomposite films covering all or part of the dielectric layer. The following description focuses on the difference therebetween.

The balanced-unbalanced transformer according to the variation is different from the balun according to Embodiment 1 in that the balun according to the variation includes a first nanocomposite film 81 and a second nanocomposite film 82. The first nanocomposite film 81 is interposed between the first electrode face 19*a* and the second electrode face 20*a*. The second nanocomposite film 82 is interposed between the unbalanced transmission line 13 and the balanced transmission line.

The nanocomposite films 81 and 82 include a second material in which particles of a first material are dispersed. The particles of the first material have a diameter of 1 nm to 200 nm. The first material has a relative permittivity higher than a relative permittivity of the second material, and a dielectric loss higher than a dielectric loss of the second material. The first material is ceramic particles including, for example, one of strontium titanate and barium strontium titanate. The second material includes, for example, one of benzocyclobutene, polyimide, polytetrafluoroethylene, and polyphenylene oxide.

Use of the first nanocomposite film or second nanocomposite film as all or part of the dielectric layer increases permittivity of the dielectric layer.

Embodiment 2

A balun according to Embodiment 2 of the present invention will be described below using the drawings.

Figure 6:
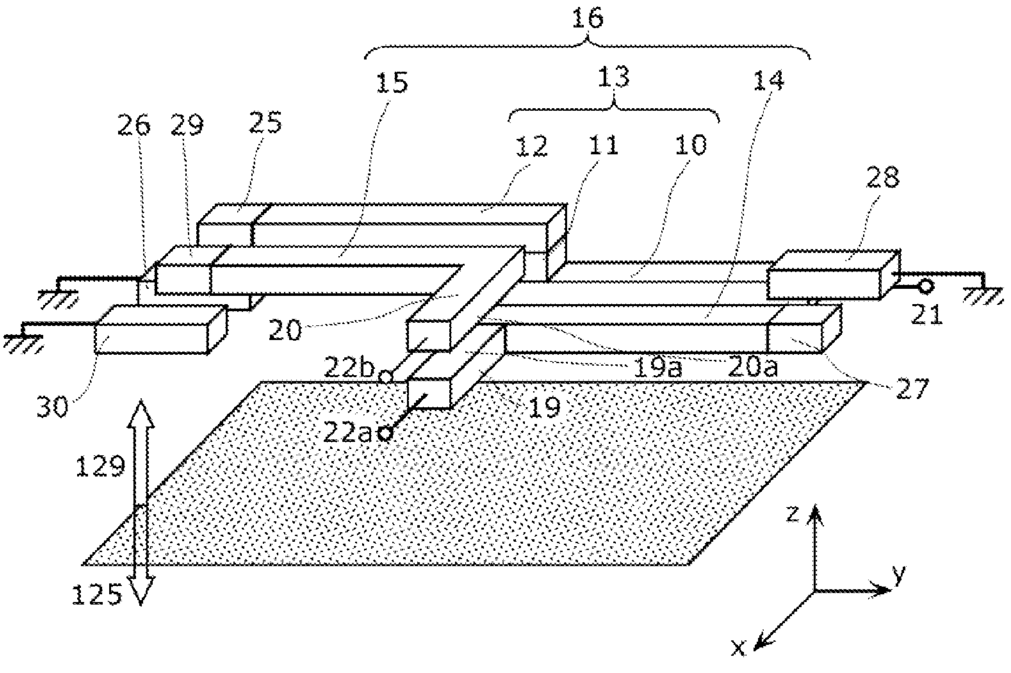
FIG. 6 is a perspective view illustrating a structure of a balun according to Embodiment 2 of the present invention.
Figure 7:
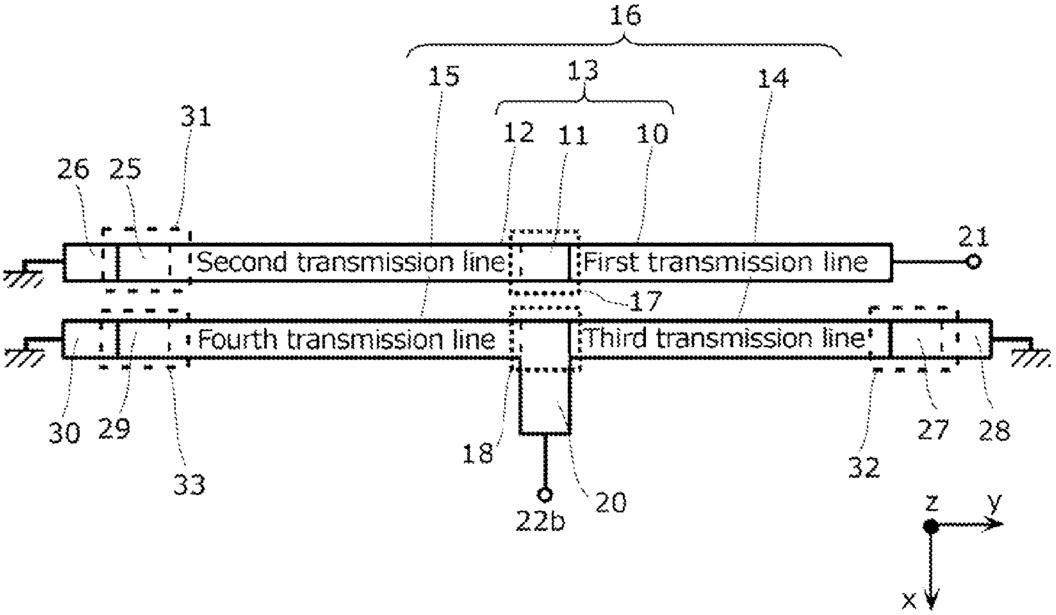
FIG. 7 is a plan view illustrating the structure of the balun according to Embodiment 2 of the present invention viewed from the z direction.

FIG. 6 is a perspective view of a balun according to Embodiment 2. FIG. 7 is a plan view of the balun according to Embodiment 2 viewed from the z direction. In FIGS. 6 and 7, the components also shown in FIG. 1A or FIG. 2A are denoted with the same reference signs, and therefore a description thereof is omitted.

The balun further includes a transmission line 25 and a transmission line 26. The transmission line 25 extends from one end portion of the transmission line 12. The one end portion is not in an overlap region 17. The transmission line 26 having an overlap region 31 at one end portion thereof is included in a wiring layer 127*a* formed in the post-passivation interconnection process. The wiring layer 127*a* is different from the wiring layer including the transmission line 25. The other end portion of the transmission line 26, which is the end portion not in the overlap region 31, is grounded. The balun further includes a transmission line 27 and a transmission line 28. The transmission line 27 extends from one end portion of the transmission line 14. The one end portion is not in an overlap region 18. The transmission line 28 having an overlap region 32 at one end portion thereof is included in a wiring layer 127*b* formed in the post-passivation interconnection process. The wiring layer 127*b* is different from the wiring layer including the transmission line 27. The other end portion end of the transmission line 28, which is the end portion not in the overlap region 32, is grounded.

The balun further includes a transmission line 29 and a transmission line 30. The transmission line 29 extends from one end portion of the transmission line 15. The one end portion is not in an overlap region 18. The transmission line 30 having an overlap region 33 at one end portion thereof is included in a wiring layer 127*a* formed in the post-passivation interconnection process. The wiring layer 127*b* is different from the wiring layer including the transmission line 29. The other end portion of the transmission line 30, which is not in the overlap region 33, is grounded.

A capacitor is formed in each of the overlap regions 31, 32, and 33. Each capacitor blocks direct current (DC) components between the balun and the ground electrode layer.

The balun according to Embodiment 2 may include two or more wiring layers. Each of the transmission lines having the overlap regions 31, 32, or 33 therebetween may be included in different wiring layers between which two or more layers are interposed.

Figure 8:
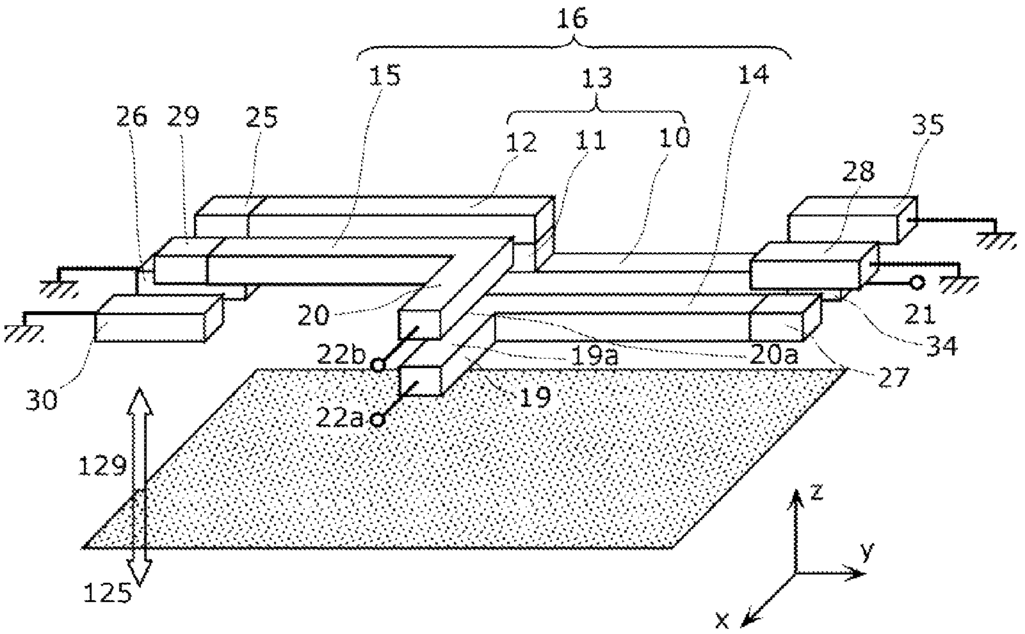
FIG. 8 is a perspective view illustrating the balun according to Embodiment 2 of the present invention, where a capacitor is included between transmission lines in parallel thereto at a single input-output terminal.
Figure 9:
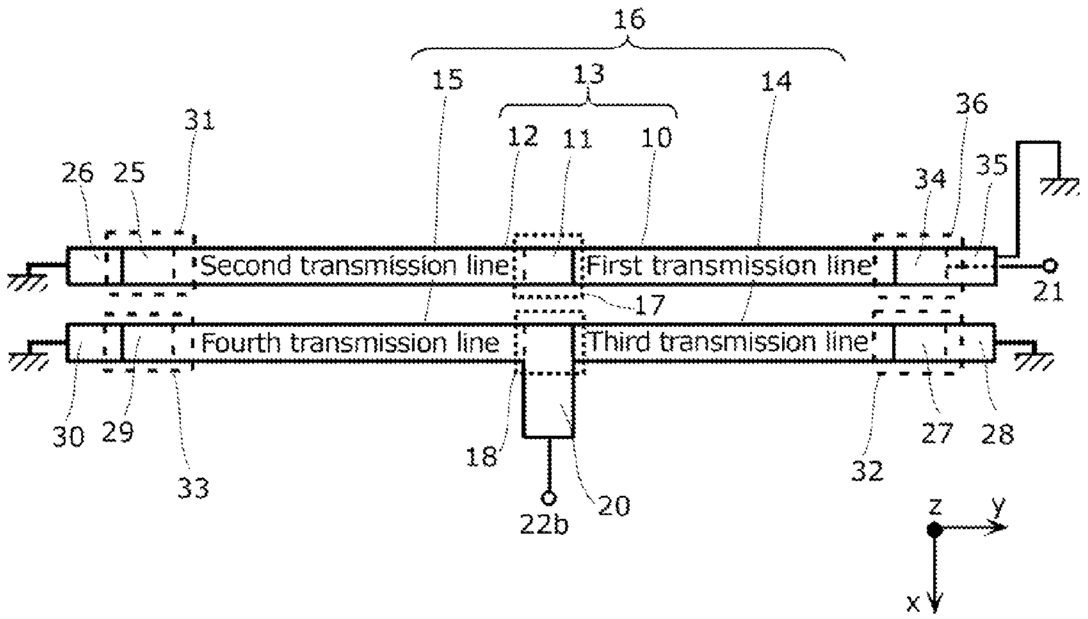
FIG. 9 is a plan view illustrating the balun according to Embodiment 2 of the present invention viewed from the z direction, where a capacitor is included between transmission lines in parallel thereto at the single input-output terminal.

For the purpose of impedance matching to external circuitry, a capacitor may be provided to the single input-output terminal 21 of the transmission line 10 in the unbalanced transmission line 13 so that the capacitor is parallel to the transmission line 10. FIG. 8 is a perspective view of a balun in which transmission lines are disposed in a layer-stacking direction, facing each other via a dielectric layer so that a parallel capacitor is formed. FIG. 9 is a plan view of the balun viewed from the z direction. In FIGS. 8 and 9, the components also shown in FIG. 6 or FIG. 7 are denoted with the same reference signs, and therefore a description thereof is omitted.

A transmission line 34 is interposed between the single input-output terminal 21 and the transmission line 10 included in the unbalanced transmission line 13. A transmission line 35 having an overlap region 36 at one end portion thereof is included in a wiring layer 127*b* formed in the post-passivation interconnection process. The wiring layer 127*b* is different from the wiring layer including the transmission line 34. The other end portion of the transmission line 35, which is the end portion not in the overlap region 36, is grounded. When the balun includes three or more wiring layers, the transmission line 35 may be included in any wiring layer other than a wiring layer including the transmission line 10 and transmission line 34.

Variation of Embodiment 2

Figure 10:
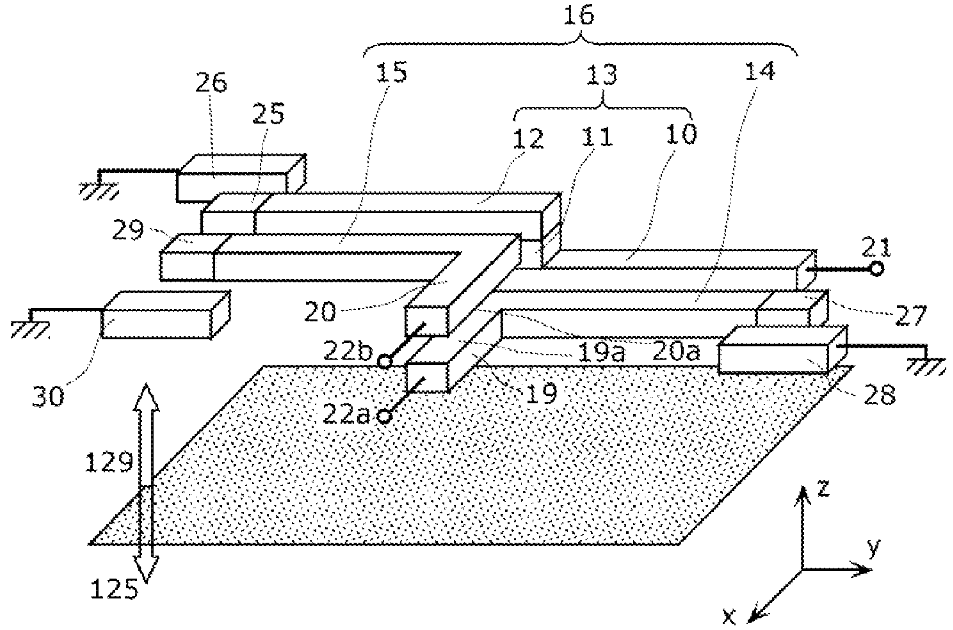
FIG. 10 is a perspective view illustrating a structure of a balun according to a variation of Embodiment 2 of the present invention.
Figure 11:
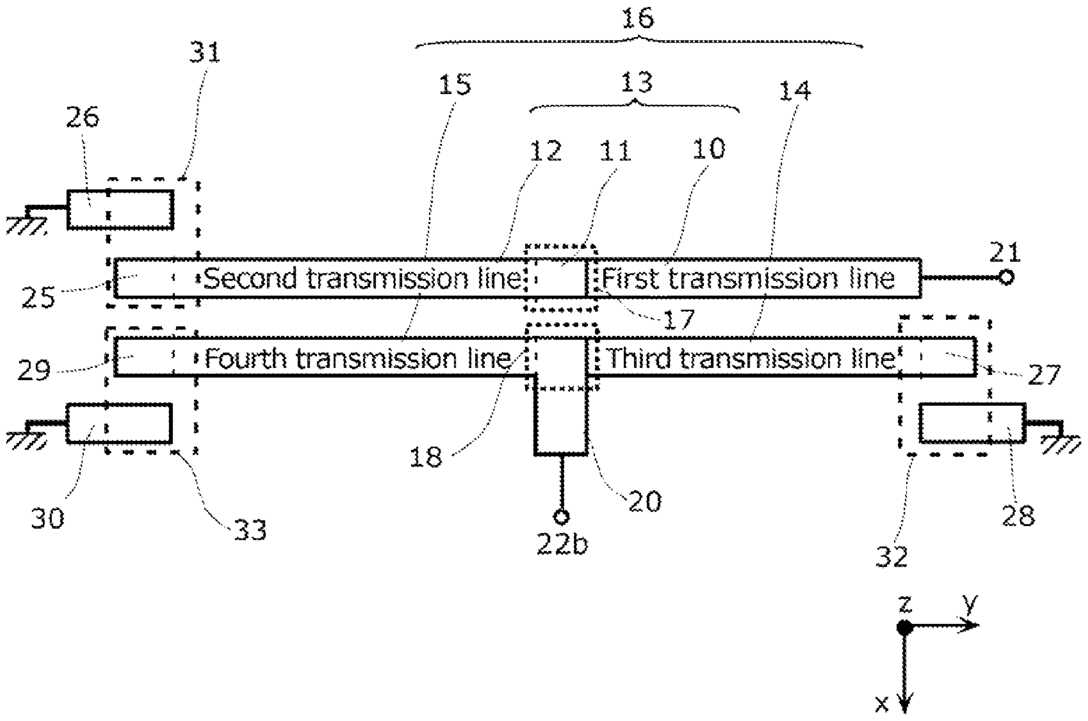
FIG. 11 is a plan view illustrating the structure of the balun according to the variation of Embodiment 2 of the present invention viewed from the z direction.

FIG. 10 is a perspective view of a balun according to a variation of Embodiment 2, and FIG. 11 is a plan view thereof viewed from the z direction. In FIGS. 10 and 11, the components also shown in FIG. 6 or FIG. 7 are denoted with the same reference signs, and therefore a description thereof is omitted. A transmission line 26 is included in the wiring layer 127*a* which is formed in the post-passivation interconnection process and coplanar with the transmission line 25 extending from the transmission line 12 included in the unbalanced transmission line 13. The transmission line 26 is disposed to face the transmission line 25 via a dielectric layer so that a capacitor is formed in an overlap region 31. Similarly, a transmission line 28 is included in the wiring layer 127*b* which is formed in the post-passivation interconnection process and coplanar with the transmission line 27 extending from the transmission line 14. The transmission line 28 is disposed to face the transmission line 27 via a dielectric layer so that a capacitor is formed in an overlap region 32. Moreover, a transmission line 30 is included in the wiring layer 127*a* which is formed in the post-passivation interconnection process and coplanar with the transmission line 29 extending from the transmission line 15. The transmission line 30 is disposed to face the transmission line 29 via a dielectric layer via a dielectric layer so that a capacitor is formed in an overlap region 33.

As described above, the balanced-unbalanced transformer according to Embodiment 2 is configured as described below.

In addition to the components of the balanced-unbalanced transformer according to Embodiment 1, the balun according to Embodiment 2 includes the transmission line 26, the transmission line 28, and the transmission line 30. The transmission line 26 faces one of (i) the other end portion of the transmission line 10, which is the end portion different from the first end portion, and (ii) the other end portion of the second transmission line 12, which is the end portion different from the second end portion. The transmission line 28 faces the other end portion of the transmission line 14, which is the end portion different from the third end portion. The transmission line 30 faces the other end portion of the transmission line 14, which is the end portion different from the fourth end portion.

The one of (i) the other end portion of the transmission line 10, which is the end portion different from the first end portion, and (ii) the other end portion of the second transmission line 12, which is the end portion different from the second end portion, is grounded via the transmission line 26.

The other end portion of the transmission line 14, which is the end portion different from the third end portion, is grounded via the transmission line 28.

The other end portion of the transmission line 15, which is the end portion different from the fourth end, is grounded via the transmission line 30.

In this configuration, capacitors are formed between one of the end portions of the unbalanced transmission line and the transmission line 26 and between the end portions of the balanced transmission line and the transmission lines 28 and 30, so that direct current (DC) components in a balanced signal or an unbalanced signal can be blocked.

Optionally, the balanced-unbalanced transformer may further include a transmission line 35 facing, via the dielectric layer, the other of (i) the other end portion of the transmission line 10, which is the end portion different from the first end portion, and (ii) the other end portion of the second transmission line 12, which is the end portion different from the second end portion.

In this configuration, a capacitor is formed between the transmission line 35 and the end portion different from the first end portion, and the capacitor can be used for impedance matching of the single input-output terminal 21 to external circuitry.

Embodiment 3

A balun according to Embodiment 3 of the present invention will be described below using the drawings.

Figure 12:
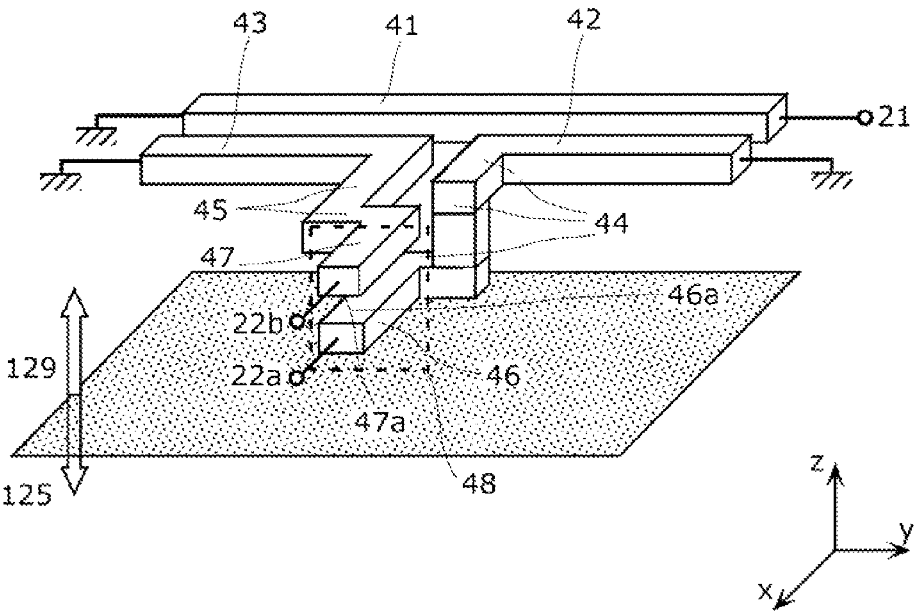
FIG. 12 is a perspective view illustrating a structure of a balun according to Embodiment 3 of the present invention.

FIG. 12 is a perspective view illustrating the balun according to Embodiment 3. In FIG. 12, the components also shown in FIG. 1A are denoted with the same reference signs, and therefore a description thereof is omitted.

An unbalanced transmission line 41 and balanced transmission lines 42 and 43 are coplanar in a wiring layer 127*b* formed in the post-passivation interconnection process. The balanced transmission line 42 has one end portion which is grounded and the other end portion which is connected to a transmission line 46 via a connecting line 44 and a contact via. The transmission line 46 is included in a wiring layer 127*a* formed in the post-passivation interconnection process and extends in the x direction. The balanced transmission line 43 has one end portion which is grounded and the other end portion which is connected to a transmission line 47 via a connecting line 45. The transmission line 47 is included in the wiring layer 127*b* and extends in the x direction. The transmission lines 46 and 47 have an overlap region 48 where the transmission lines 46 and 47 overlap each other via a dielectric layer in the layer-stacking direction. Located between the balanced input-output terminals 22*a* and 22*b*, the overlap region 48 functions as a capacitor connected in parallel with the balanced input-output terminals 22*a* and 22*b*. In other words, the upper face of the transmission line 46 is a first electrode face 46*a*. The lower face of the transmission line 47 is a second electrode face 47*a*. The first electrode face 46*a* and the second electrode face 47*a* are electrode faces of the capacitor.

Embodiment 4

A balun according to Embodiment 4 of the present invention will be described below using the drawings.

Figure 13:
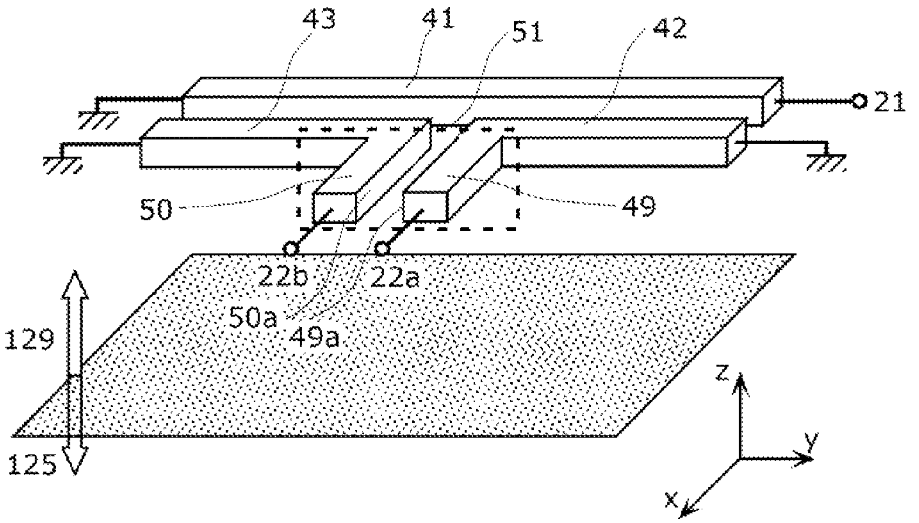
FIG. 13 is a perspective view illustrating a structure of a balun according to Embodiment 4 of the present invention.
Figure 14A:
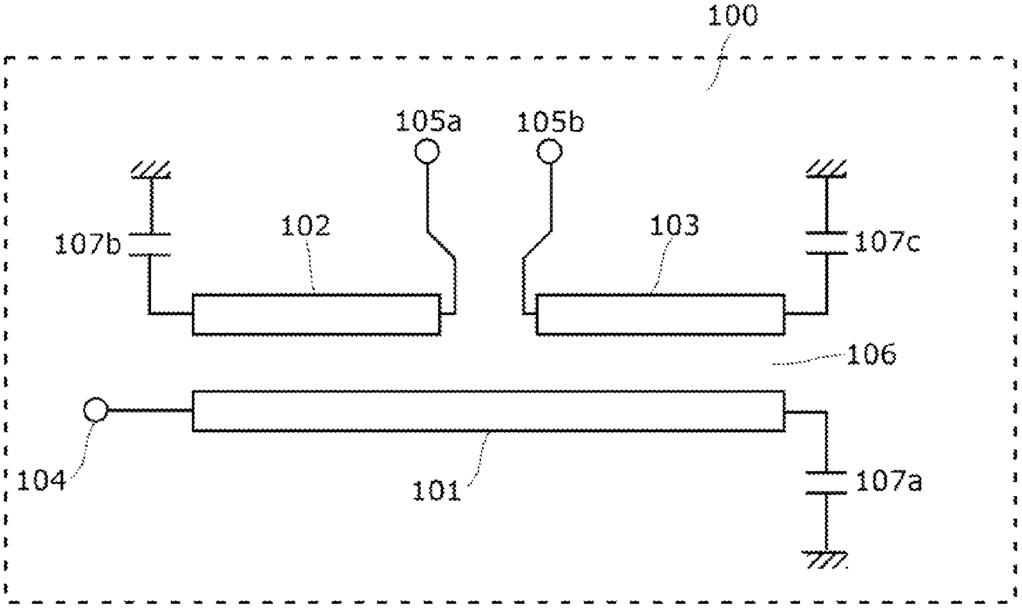
FIG. 14A Prior Art
FIG. 14A is a schematic block diagram of a Marchand balun.
Figure 14B:
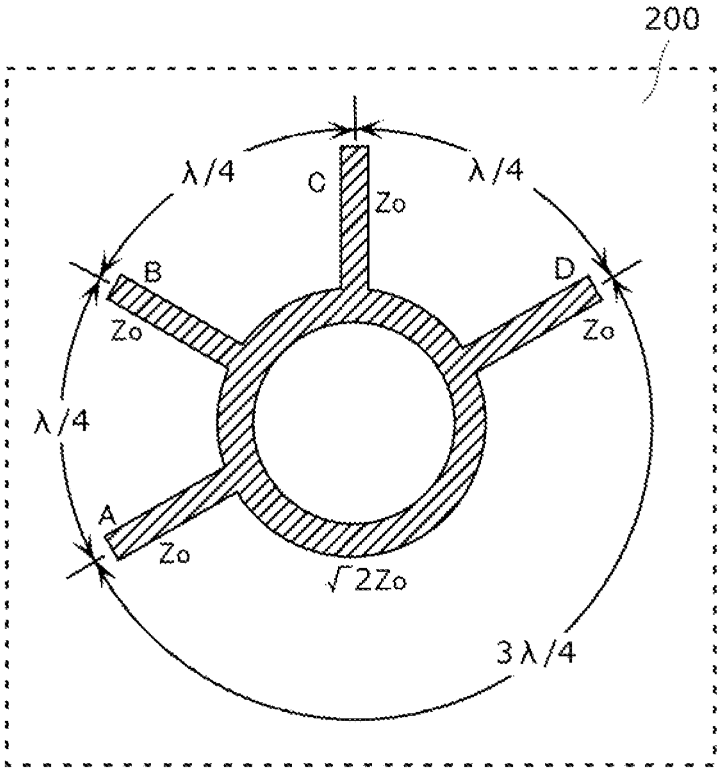
FIG. 14B Prior Art
FIG. 14B is a schematic block diagram of a rat-race coupler, which is of a type of baluns.
Figure 15:
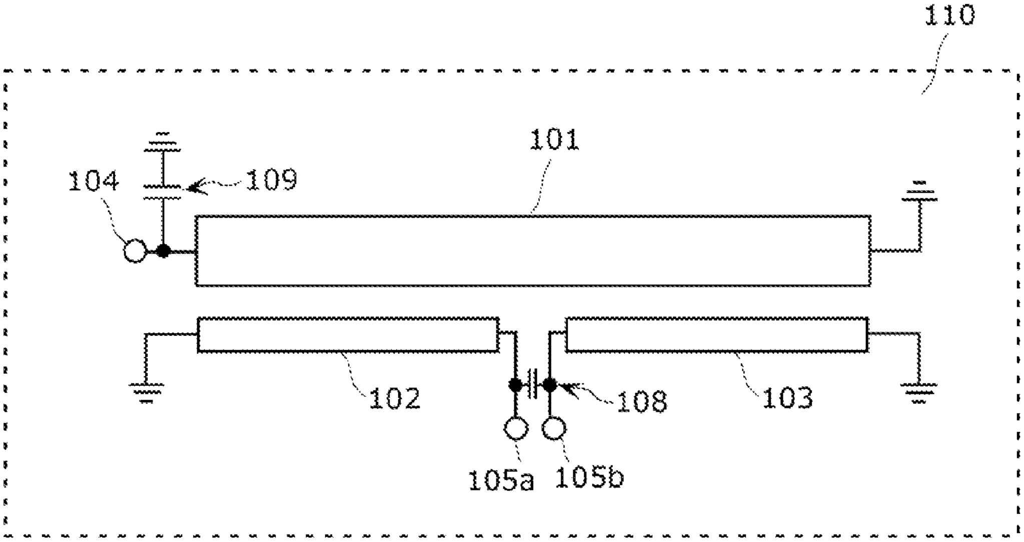
FIG. 15 Prior Art
FIG. 15 illustrates a structure of a conventional balun having a capacitor between balanced input-output terminals.
Figure 16:
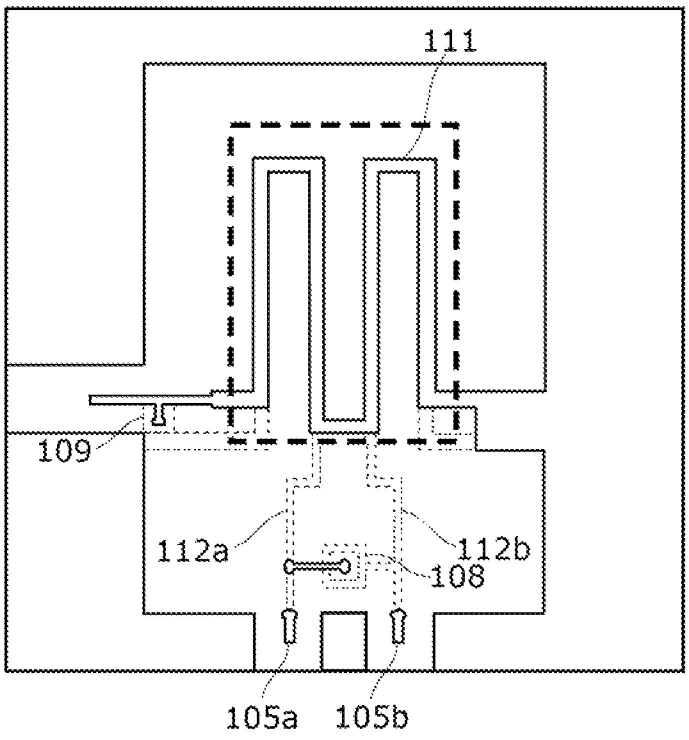
FIG. 16 Prior Art
FIG. 16 illustrates am actual layout of a conventional balun.

FIG. 13 is a perspective view illustrating the balun according to Embodiment 4. In FIG. 13, the components also shown in FIG. 12 are denoted with the same reference signs, and therefore a description thereof is omitted.

An unbalanced transmission line 41 and balanced transmission lines 42 and 43 are all coplanar. The unbalanced transmission line 41 and the balanced transmission lines 42 and 43 may be included either in a wiring layer 127*a* or in a wiring layer 127*b*. The wiring layer 127*a* and wiring layer 127*b* are formed in the post-passivation interconnection process. When the balun according to Embodiment 4 includes three or more layers in section, the unbalanced transmission line 41 and the balanced transmission lines 42 and 43 may be included in a wiring layer other than the wiring layers 127*a* and 127*b*. The balanced-unbalanced transformer according to Embodiment 4 includes a transmission line 49 and a transmission line 50. The balanced transmission line 42 has one end portion which is grounded and the other end portion from which the transmission line 49 extends. The balanced transmission line 43 has one end portion which is grounded and the other end portion from which the transmission line 50 extends. The transmission lines 49 and 50 have an overlap region 51 where the transmission lines 46 and 47 overlap each other via a dielectric layer in a direction perpendicular to the layer-stacking direction. Located between the balanced input-output terminals 22*a* and 22*b*, the overlap region 51 functions as a capacitor connected in parallel with the balanced input-output terminals 22*a* and 22*b*. In other words, the left-side face of the transmission line 49 in FIG. 13 is a first electrode face 49*a*. The right-side face of the transmission line 50 is a second electrode face 50*a*. The first electrode face 49*a* and the second electrode face 50*a* are electrode faces of the capacitor.

As in Embodiment 1, the portion between the unbalanced transmission line and the balanced transmission line or the portion of the dielectric layer between the electrodes which are the transmission lines and have faces which function as the electrode faces of the capacitor in Embodiment 2 or 3 may be a nanocomposite film including a second material in which particles of a first material are dispersed and thereby having high permittivity. Here, the first material has a relative permittivity higher than that of the second material and a dielectric loss higher than that of the second material. It is preferable to selectively as necessary use a high-dielectric nanocomposite film as the portion between the unbalanced transmission line and the balanced transmission line or the portion of the dielectric layer between the electrodes which are the transmission lines and have faces which function as the electrode faces of the capacitor.

It is preferable that the particles of the first material have a diameter of 1 nm to 200 nm. The first material may be ceramic. In this case, the ceramic may include strontium titanate or barium strontium titanate.

The second material may include benzocyclobutene, polyimide, polytetrafluoroethylene, or polyphenylene oxide It should be noted that the present invention is not limited to these embodiments, which have been used for describing the balun structures according to the present invention. The present invention also includes variations of these embodiments to be conceived by those skilled in the art and embodiments where the constituent elements in these embodiments are used in any combination unless they depart from the spirit and scope of the present invention.

The embodiments disclosed herein are exemplary in respects and should never be considered limiting. The scope of the present invention is indicated not by the description above but by the claims, and is intended to include any modification within the scope and the sense of equivalents of the claims.

Although only some exemplary embodiments of the present invention have been described in detail above, those skilled in the art will readily appreciate that many modifications are possible in the exemplary embodiments without materially departing from the novel teachings and advantages of the present invention. Accordingly, all such modifications are intended to be included within the scope of the present invention.

INDUSTRIAL APPLICABILITY

The present invention is appropriately applicable to balanced-unbalanced transformers which are included in high-frequency semiconductor devices such as communication devices and radars.

The invention claimed is:

1. A balanced-unbalanced transformer comprising:

a balanced transmission line including paired transmission lines for input or output of a balanced signal, the paired transmission lines being disposed adjacently and aligned in a longitudinal direction;

an unbalanced transmission line for input or output of an unbalanced signal, the unbalanced transmission line being in parallel with the balanced transmission line and facing the balanced transmission line; and two lead transmission lines one of which is connected to one end portion of one of the paired transmission lines at a right angle to the one of the paired transmission lines, and the other of which is connected to one end portion of the other of the paired transmission lines at a right angle to the other of the paired transmission lines, the one end portion of the one of the paired transmission lines and the one end portion of the other of the paired transmission lines being neighboring two end portions of four end portions of the paired transmission lines, wherein the one of the two lead transmission lines has a first electrode face which faces the other of the two lead transmission lines, the other of the two lead transmission lines has a second electrode face which faces the one of the two lead transmission lines, and the first electrode face and the second electrode face are electrode faces of a capacitor.

2. The balanced-unbalanced transformer according to claim 1, further comprising:

a silicon semiconductor substrate;

a first dielectric layer stacked above the silicon semiconductor substrate;

a wiring layer stacked above the first dielectric layer;

a protective layer stacked above the wiring layer;

a second dielectric layer stacked above the protective layer; and a plurality of wiring layers included in the second dielectric layer;

wherein the balanced transmission line, the unbalanced transmission line, and the two lead transmission lines are included in the plurality of wiring layers.

3. The balanced-unbalanced transformer according to claim 2, wherein the unbalanced transmission line includes:

a first transmission line extending in a first direction in a first wiring layer which is one of the wiring layers included in the second dielectric layer;

a second transmission line extending in the first direction in a second wiring layer which is an other of the wiring layers included in the second dielectric layer and not in contact with the first wiring layer; and a via electrically connecting a first end portion of the first transmission line and a second end portion of the second transmission line in a region where the first end portion and the second end portion overlap each other in a layer-stacking direction, the first end portion being one end portion of the first transmission line and located in a direction opposite to the first direction, and the second end portion being one end portion of the second transmission line and located in the first direction, the balanced transmission line includes:

a third transmission line being the one of the paired transmission lines and extending in the first direction in the first wiring layer; and a fourth transmission line being the other of the paired transmission lines and extending in the first direction in the second wiring layer, the one of the two lead transmission lines is a fifth transmission line extending in a second direction from a third end portion of the third transmission line, the second direction being perpendicular to the first direction and the layer-stacking direction and the third end portion being one end portion of the third transmission line and located in the direction opposite to the first direction, the other of the two lead transmission lines is a sixth transmission line extending in the second direction from a fourth end portion of the fourth transmission line, the fourth end portion being one end portion of the fourth transmission line and located in the first direction, one of (i) the other end portion of the first transmission line and (ii) the other end portion of the second transmission line is grounded, and the other of (i) the first transmission line and (ii) the other end portion of the second transmission line is an end portion for input or output of the unbalanced signal, the other end portion of the third transmission line is grounded, the other end portion of the fourth transmission line is grounded, the fifth transmission line and the sixth transmission line are transmission lines for output or input of the balanced signal, the fifth transmission line has the first electrode face which faces the sixth transmission line, and the sixth transmission line has the second electrode face which faces the fifth transmission line.

4. The balanced-unbalanced transformer according to claim 3, further comprising a fourth ground electrode facing, via a dielectric layer, the other of (i) the other end portion of the first transmission line and (ii) the other end portion of the second transmission line.

5. The balanced-unbalanced transformer according to claim 3, further comprising:

a first ground electrode facing the one of (i) the other end portion of the first transmission line and (ii) the other end portion of the second transmission line;

a second ground electrode facing the other end portion of the third transmission line; and a third ground electrode facing the other end portion of the fourth transmission line, wherein the one of (i) the other end portion of the first transmission line and (ii) the other end portion of the second transmission line is grounded via the first ground electrode, the other end portion of the third transmission line is grounded via the second ground electrode, and the other end portion of the fourth transmission line is grounded via the third ground electrode.

6. The balanced-unbalanced transformer according to claim 5, further comprising a fourth ground electrode facing, via a dielectric layer, the other of (i) the other end portion of the first transmission line and (ii) the other end portion of the second transmission line.

7. The balanced-unbalanced transformer according to claim 1, wherein the unbalanced transmission line includes:

a first transmission line extending in a first direction in a first wiring layer;

a second transmission line extending in the first direction in a second wiring layer which is not in contact with the first wiring layer; and a via electrically connecting a first end portion of the first transmission line and a second end portion of the second transmission line in a region where the first end portion and the second end portion overlap each other in a layer-stacking direction, the first end portion being one end portion of the first transmission line and located in a direction opposite to the first direction, and the second end portion being one end portion of the second transmission line and located in the first direction, the balanced transmission line includes:

a third transmission line being the one of the paired transmission lines and extending in the first direction in the first wiring layer; and a fourth transmission line being the other of the paired transmission lines and extending in the first direction in the second wiring layer, the one of the two lead transmission lines is a fifth transmission line extending in a second direction from a third end portion of the third transmission line, the second direction being perpendicular to the first direction and the layer-stacking direction, and the third end portion being one end portion of the third transmission line and located in the direction opposite to the first direction, the other of the two lead transmission lines is a sixth transmission line extending in the second direction from a fourth end portion of the fourth transmission line, the fourth end portion being an one end portion of the fourth transmission line and located in the first direction, one of (i) the other end portion of the first transmission line and (ii) the other end portion of the second transmission line is grounded, and the other of (i) the other end portion of the first transmission line and (ii) the other end portion of the second transmission line is an end portion for input or output of the unbalanced signal, the other end portion of the third transmission line is grounded, the other end portion of the fourth transmission line is grounded, the fifth transmission line and the sixth transmission line are transmission lines for output or input of the balanced signal, the fifth transmission line has the first electrode face which faces the sixth transmission line, and the sixth transmission line has the second electrode face which faces the fifth transmission line.

8. The balanced-unbalanced transformer according to claim 7, further comprising a fourth ground electrode facing, via a dielectric layer, the other of the other end portion of the first transmission line and the other end portion of the second transmission line.

9. The balanced-unbalanced transformer according to claim 7, further comprising:

a first ground electrode facing the one of (i) the other end portion of the first transmission line and (ii) the other end portion of the second transmission line;

a second ground electrode facing the other end portion of the third transmission line; and a third ground electrode facing the other end portion of the fourth transmission line, wherein the one of (i) the other end portion of the first transmission line and (ii) the other end portion of the second transmission line is grounded via the first ground electrode, the other end portion of the third transmission line is grounded via the second ground electrode, and the other end portion of the fourth transmission line is grounded via the third ground electrode.

10. The balanced-unbalanced transformer according to claim 9, further comprising a fourth ground electrode facing, via a dielectric layer, the other of the other end portion of the first transmission line and the other end portion of the second transmission line.

11. The balanced-unbalanced transformer according to claim 1, further comprising a first nanocomposite film interposed between the first electrode face and the second electrode face, wherein the first nanocomposite film includes a second material in which particles of a first material are dispersed, the particles of the first material have a diameter of 1 nm to 200 nm, and the first material has a relative permittivity higher than a relative permittivity of the second material and a dielectric loss higher than a dielectric loss of the second material.

12. The balanced-unbalanced transformer according to claim 11, further comprising a second nanocomposite film interposed between the unbalanced transmission line and the balanced transmission line, wherein the second nanocomposite film includes the second material in which particles of the first material are dispersed.

13. The balanced-unbalanced transformer according to claim 12, wherein the first material includes one of strontium titanate and barium strontium titanate, and the second material includes one of benzocyclobutene, polyimide, polytetrafluoroethylene, and polyphenylene oxide.

14. The balanced-unbalanced transformer according to claim 2, further comprising a first nanocomposite film interposed between the first electrode face and the second electrode face, wherein the first nanocomposite film includes a second material in which particles of a first material are dispersed, the particles of the first material have a diameter of 1 nm to 200 nm, and the first material has a relative permittivity higher than a relative permittivity of the second material and a dielectric loss higher than a dielectric loss of the second material.

15. The balanced-unbalanced transformer according to claim 14, further comprising a second nanocomposite film interposed between the unbalanced transmission line and the balanced transmission line, wherein the second nanocomposite film includes the second material in which particles of the first material are dispersed.

16. The balanced-unbalanced transformer according to claim 15, wherein the first material includes one of strontium titanate and barium strontium titanate, and the second material includes one of benzocyclobutene, polyimide, polytetrafluoroethylene, and polyphenylene oxide.

17. The balanced-unbalanced transformer according to claim 7, further comprising a first nanocomposite film interposed between the first electrode face and the second electrode face, wherein the first nanocomposite film includes a second material in which particles of a first material are dispersed, the particles of the first material have a diameter of 1 nm to 200 nm, and the first material has a relative permittivity higher than a relative permittivity of the second material and a dielectric loss higher than a dielectric loss of the second material.

18. The balanced-unbalanced transformer according to claim 17, further comprising a second nanocomposite film interposed between the unbalanced transmission line and the balanced transmission line, wherein the second nanocomposite film includes the second material in which particles of the first material are dispersed.

19. The balanced-unbalanced transformer according to claim 18, wherein the first material includes one of strontium titanate and barium strontium titanate, and the second material includes one of benzocyclobutene, polyimide, polytetrafluoroethylene, and polyphenylene oxide.

* * * * *